United States Patent
Zhou et al.

(10) Patent No.: US 7,870,888 B2
(45) Date of Patent: Jan. 18, 2011

(54) BASE FOR HEAT RADIATOR, HEAT DISSIPATION ASSEMBLY FOR CENTRAL PROCESSING UNIT, AND METHOD OF USING THE SAME

(75) Inventors: Chunnan Zhou, Northbrook, IL (US); Simeon Chou, Koahsiung (TW)

(73) Assignee: Illinois Tool Works Inc., Glenview, IL (US)

( * ) Notice: Subject to any disclaimer, the term of this patent is extended or adjusted under 35 U.S.C. 154(b) by 809 days.

(21) Appl. No.: 11/467,430

(22) Filed: Aug. 25, 2006

(65) Prior Publication Data
US 2007/0044945 A1 Mar. 1, 2007

(30) Foreign Application Priority Data

| Aug. 26, 2005 | (TW) | ................ 94214788 U |
| Sep. 9, 2005 | (CN) | .............. 2005 2 0105229 U |
| Jun. 23, 2006 | (TW) | ................ 95211043 U |

(51) Int. Cl.
*F28F 7/00* (2006.01)

(52) U.S. Cl. .............. 165/80.3; 361/690; 361/704; 361/709; 361/719

(58) Field of Classification Search ............ 361/719, 361/704, 709; 165/80.3, 185, 80.2; 439/331
See application file for complete search history.

(56) References Cited

U.S. PATENT DOCUMENTS

| 5,384,940 | A | * | 1/1995 | Soule et al. ............... 361/719 |
| 5,713,690 | A | * | 2/1998 | Corbin et al. ............. 361/704 |
| 5,880,930 | A | * | 3/1999 | Wheaton .................. 165/80.3 |
| 5,901,039 | A | * | 5/1999 | Dehaine et al. ........... 361/704 |
| 6,137,298 | A | * | 10/2000 | Binns ........................ 439/331 |
| 6,244,875 | B1 | * | 6/2001 | McHugh et al. ........... 439/331 |
| 6,442,045 | B1 | * | 8/2002 | Goodwin et al. ........... 361/816 |
| 6,449,162 | B1 | * | 9/2002 | Corbin et al. ............. 361/719 |
| 6,545,879 | B1 | * | 4/2003 | Goodwin .................. 361/709 |
| 6,549,410 | B1 | * | 4/2003 | Cohen ....................... 361/704 |
| 6,611,431 | B1 | * | 8/2003 | Lee et al. .................. 361/719 |
| 6,654,254 | B2 | * | 11/2003 | Szu et al. .................. 361/760 |
| 6,680,848 | B2 | * | 1/2004 | Petit et al. ................ 361/704 |
| 6,697,256 | B1 | * | 2/2004 | Horng et al. .............. 361/704 |
| 6,826,054 | B2 | * | 11/2004 | Liu ........................... 361/719 |
| 6,859,370 | B1 | * | 2/2005 | Hsu et al. .................. 361/752 |
| 6,866,540 | B2 | * | 3/2005 | Robertson ................. 361/704 |
| 7,019,979 | B2 | * | 3/2006 | Wang et al. ............... 361/719 |
| 7,032,305 | B2 | * | 4/2006 | Petit et al. ................ 361/704 |
| 7,042,727 | B2 | * | 5/2006 | Ulen et al. ................ 361/704 |
| 7,068,513 | B1 | * | 6/2006 | Xia et al. .................. 361/704 |
| 7,126,823 | B2 | * | 10/2006 | Chen et al. ............... 165/80.3 |
| 7,126,826 | B1 | * | 10/2006 | Sorensen et al. .......... 361/719 |
| 7,142,422 | B2 | * | 11/2006 | Lee et al. .................. 165/80.3 |

(Continued)

*Primary Examiner*—Ljiljana (Lil) V Ciric
(74) *Attorney, Agent, or Firm*—Lowe, Hauptman, Ham & Berner, LLP

(57) ABSTRACT

A heat dissipation assembly for a central processing unit includes a heat radiator adapted to contact the central processing unit from above and a base adapted to support the central processing unit from below. The base includes at least a snap-on fastening mechanism adapted to snap into a through hole formed in a supporting substrate of the central processing unit. The heat radiator includes at least a fastener receiving portion for receiving an elongated fastener and aligning the elongated fastener with a matching engaging element of the snap-on fastening mechanism.

19 Claims, 10 Drawing Sheets

U.S. PATENT DOCUMENTS

| | | | |
|---|---|---|---|
| 7,180,743 B2 * | 2/2007 | Chen et al. | 361/704 |
| 7,209,354 B2 * | 4/2007 | Wu et al. | 361/719 |
| 7,225,529 B2 * | 6/2007 | Wang | 29/739 |
| 7,262,969 B2 * | 8/2007 | Lee et al. | 361/704 |
| 7,283,368 B2 * | 10/2007 | Wung et al. | 165/80.3 |
| 7,286,371 B2 * | 10/2007 | Unrein | 361/709 |
| 7,292,447 B2 * | 11/2007 | Xia et al. | 361/719 |
| 7,310,229 B2 * | 12/2007 | Lee et al. | 257/719 |
| 7,315,449 B2 * | 1/2008 | Lewis | 257/719 |
| 7,333,340 B2 * | 2/2008 | Zhang et al. | 361/719 |
| 7,342,795 B2 * | 3/2008 | Lee et al. | 361/719 |
| 7,342,796 B2 * | 3/2008 | Aukzemas | 361/719 |
| 7,344,345 B2 * | 3/2008 | Aukzemas | 411/372 |
| 7,345,881 B2 * | 3/2008 | Colbert et al. | 165/80.3 |
| 7,359,200 B2 * | 4/2008 | Zhou et al. | 361/704 |
| 7,375,963 B2 * | 5/2008 | Eckberg et al. | 361/704 |
| 7,428,154 B2 * | 9/2008 | Ishimine et al. | 361/704 |
| 7,468,889 B2 * | 12/2008 | Su | 361/719 |
| 7,474,532 B1 * | 1/2009 | Desrosiers et al. | 361/719 |
| 7,495,922 B2 * | 2/2009 | Ploeg et al. | 361/719 |
| 7,535,713 B2 * | 5/2009 | Lin | 361/704 |
| 7,558,066 B2 * | 7/2009 | Eckberg et al. | 361/704 |
| 7,576,989 B2 * | 8/2009 | Li et al. | 361/719 |
| 7,606,032 B2 * | 10/2009 | Lin | 361/704 |
| 7,609,522 B2 * | 10/2009 | Jin et al. | 165/80.3 |
| 7,626,822 B2 * | 12/2009 | Ma et al. | 361/719 |
| 7,684,198 B2 * | 3/2010 | Fang | 361/719 |
| 7,729,122 B2 * | 6/2010 | Wong | 361/719 |
| 2004/0052054 A1 * | 3/2004 | Huang et al. | 361/719 |
| 2006/0245165 A1 * | 11/2006 | Lin | 361/704 |

* cited by examiner

BASE FOR HEAT RADIATOR, HEAT DISSIPATION ASSEMBLY FOR CENTRAL PROCESSING UNIT, AND METHOD OF USING THE SAME

RELATED APPLICATIONS

This application claims priority from Taiwanese Application No. 04214788 filed Aug. 26, 2005, Taiwanese Application No. 95211043 filed Jun. 28, 2006, and Chinese Application No. 200520105229.8 filed Aug. 26, 2005, all of which are incorporated by reference herein in their entirety.

Technical Field

The present invention relates to a base for a heat radiator, a heat dissipation assembly for a central processing unit, and a method of using the same.

Background

A conventional heat dissipation module 2 for a central processing unit 1, as shown in FIG. 1, usually comprises a heat radiator 21 mounted on the central processing unit 1 and a heat dissipation fan 22 arranged above the heat radiator 21. The heat generated by the central processing unit 1 is transferred to the heat radiator 21 and then removed with the heat dissipation fan 22. Thus, the operational temperature of the central processing unit 1 can be maintained at a desired level to ensure normal operation of the central processing unit.

The installation of the heat dissipation module 2, as shown in FIGS. 1 and 2, comprises mounting a base 23 to an underside of a circuit board 3 supporting the central processing unit 1. Arms 231 extend from four corners of the base 23. The arms 231 define through holes 2311 through which posts 25 extend. Further, four corners of the heat dissipation module 2, e.g., the heat dissipation fan 22, are provided with locking tubes 221, which correspond to the through holes 2311 of the arms 231. The locking tubes 221 receive threaded fasteners 27 extending therethrough. A resilient element 28 is fit over an outer circumference of each threaded fastener 27. Thus, the heat dissipation module 2 can be securely fixed to the central processing unit 1 by extending the threaded fasteners 27 through the locking tubes 221 and through holes 31 defined in the circuit board 3 to threadedly engage the upper, hollow and threaded heads of posts 25 provided on the arms 231 of the base 23.

The mounting base 23 is often used because the heat dissipation module 2 cannot be directly screwed to the circuit board 3, which generally has a weak mechanical strength, to avoid undesired deformation of the circuit board 3 which may be caused by the installation of the heat dissipation module 2 and may affect the operation of the central processing unit 1. Thus, mounting base 23 is added to the underside of the circuit board 3 in most, but not all, cases. The base 23 must have a sufficient strength in order to stably position the heat dissipation module 2. Thus, currently all manufacturers make the base 23 with metal in order to obtain better strength. When the base 23 is made of metal, in order to avoid short circuits of or undesired interference with the electrical paths of the circuit board 3, an insulation piece 24 must be arranged between the base 23 and the circuit board 3. The insulation piece 24 has a shape exactly corresponding to the base 23 and is also provided with arms 241 extending from four corners thereof, the arms 241 defining through holes 2411. With the provision of the insulation piece 24, interference with the electrical paths of the circuit board 3 can be avoided.

In addition, in the mounting of the heat dissipation module 2, the base 23 and the insulation piece 24 are put together first and then the posts 25 are inserted through the holes 31 of the circuit board 3. The upper ends of posts 25 are sized and/or shaped to be insertable through holes 31 of PCB 3 and holes 2411 of insulator 42. To temporarily and stably retain the base 23 and the insulation piece 24 on the circuit board 3, a C-clip 26 is required to fit over each post 25. The base 23 and the insulation piece 24 are thus prevented from separating from the circuit board 3 during the assembly process by forming a stop with the C-clips 26. Additionally or alternatively, glue can be used to temporarily and stably retain the base 23 and the insulation piece 24 on the circuit board 3.

The conventional heat dissipation module 2, although effective in effecting heat dissipation from the central processing unit 1, has the following disadvantages:

(1) Since the base 23 is made of metal, certain interference, such as electrical field interference, with the electrical paths of the circuit board 3 exists despite the presence of insulation piece 24.

(2) The conventional heat dissipation module 2 requires the arrangement of an additional insulation piece 24 and the application of glue between the base 23 and the circuit board 3, which increase costs.

(3) A C-clip 26 must be used to temporarily retain the base 23 of the conventional heat dissipation module 2 on the circuit board 3, which increases the number of manufacturing/mounting steps.

Thus, there is a need for a base for a heat radiator, a heat dissipation assembly for a central processing unit, and a method of using the same to overcome the drawbacks of the conventional heat dissipation module.

SUMMARY

In an aspect, a heat dissipation assembly for a central processing unit comprises a heat radiator adapted to contact the central processing unit from above, and a base adapted to support the central processing unit from below. The base comprises at least a snap-on fastening mechanism adapted to snap into a through hole formed in a supporting substrate of the central processing unit. The heat radiator comprises at least a fastener receiving portion for receiving an elongated fastener and aligning the elongated fastener with a matching engaging element of the snap-on fastening mechanism.

In a further aspect, a base for use with a heat radiator on top of a central processing unit is adapted to support the central processing unit from below. The base comprises at least a snap-on fastening mechanism adapted to snap into a through hole formed in a supporting substrate of the central processing unit; and an engaging element within said snap-on fastening mechanism and adapted to engage with an elongated fastener used for fastening, in use, the heat radiator to said base with the central processing unit positioned therebetween.

In a further aspect, a method of mounting a heat radiator on top of a central processing unit using a base is provided. The base comprises at least a snap-on fastening mechanism and an engaging element within said snap-on fastening mechanism. The method comprises snapping a through hole formed in a supporting substrate of the central processing unit over the snap-on fastening mechanism of said base to temporarily fixing said central processing unit on said base; and fastening the heat radiator placed on top of the central processing unit to said base using an elongated fastener that engages with the engaging element of said base.

Additional aspects and advantages of the disclosed embodiments are set forth in part in the description which follows, and in part are obvious from the description, or may be learned by practice of the disclosed embodiments. The aspects and advantages of the disclosed embodiments may also be realized and attained by the means of the instrumentalities and combinations particularly pointed out in the appended claims.

BRIEF DESCRIPTION OF THE DRAWINGS

The disclosed embodiments are illustrated by way of example, and not by limitation, in the figures of the accompanying drawings, wherein elements having the same reference numeral designations represent like elements throughout.

DETAILED DESCRIPTION OF EMBODIMENTS

Figure 1:
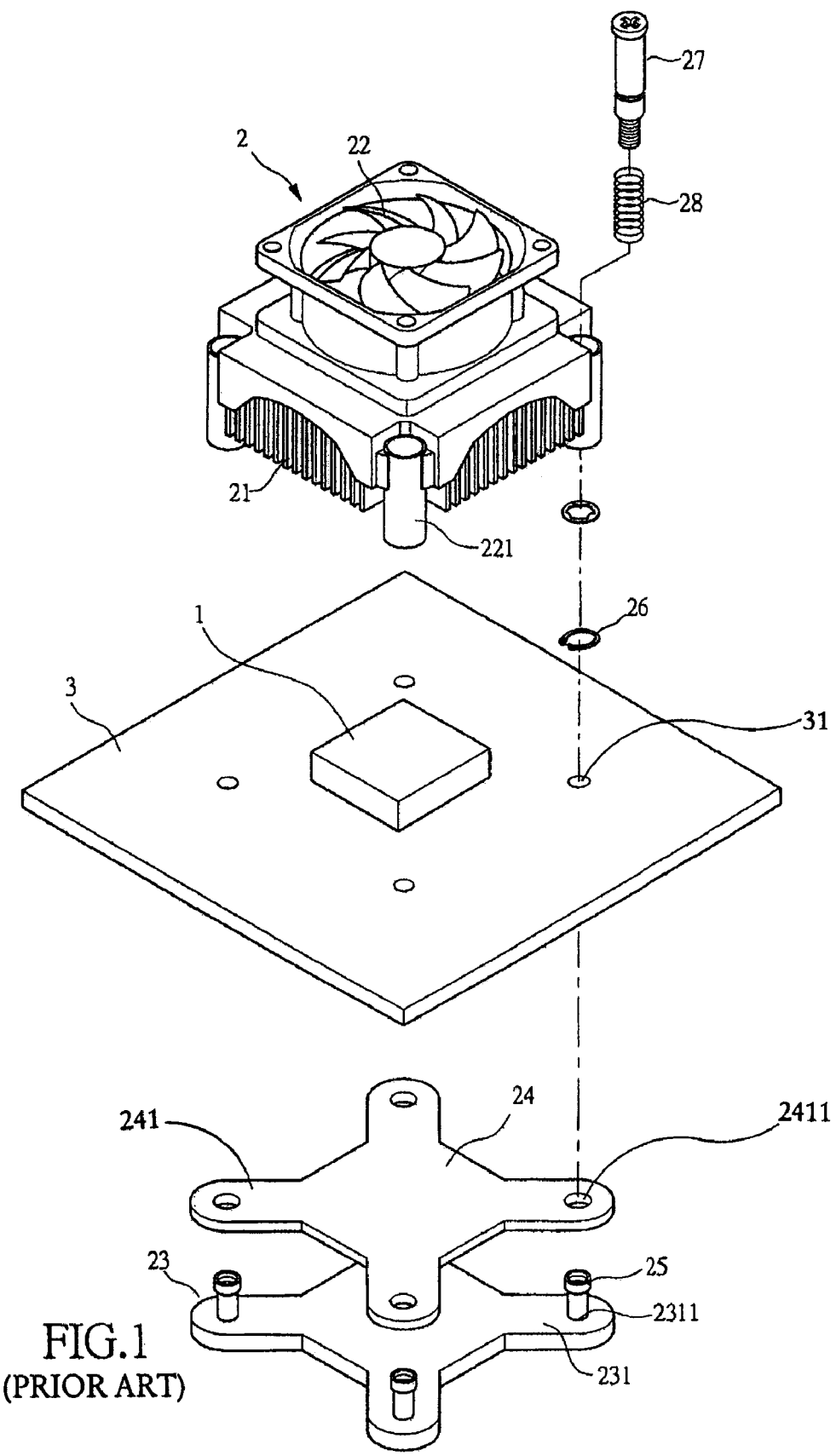
FIG. 1 is an exploded view of a conventional heat dissipation module.
Figure 2:
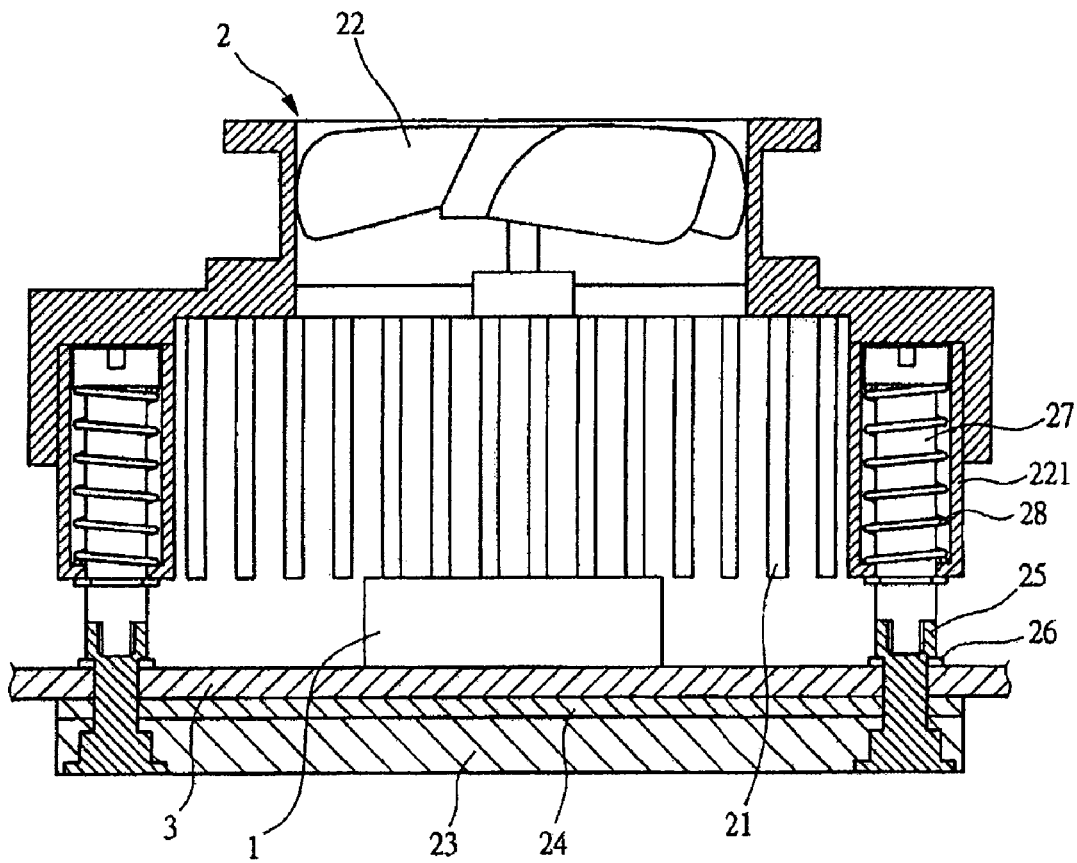
FIG. 2 is a cross sectional view illustrating the conventional heat dissipation module in use.

In the following detailed description, for purposes of explanation, numerous specific details are set forth in order to provide a thorough understanding of the embodiments. It will be apparent, however, that the embodiments may be practiced without these specific details. In other instances, well-known structures and devices are schematically shown in order to simplify the drawing.

Figure 3:
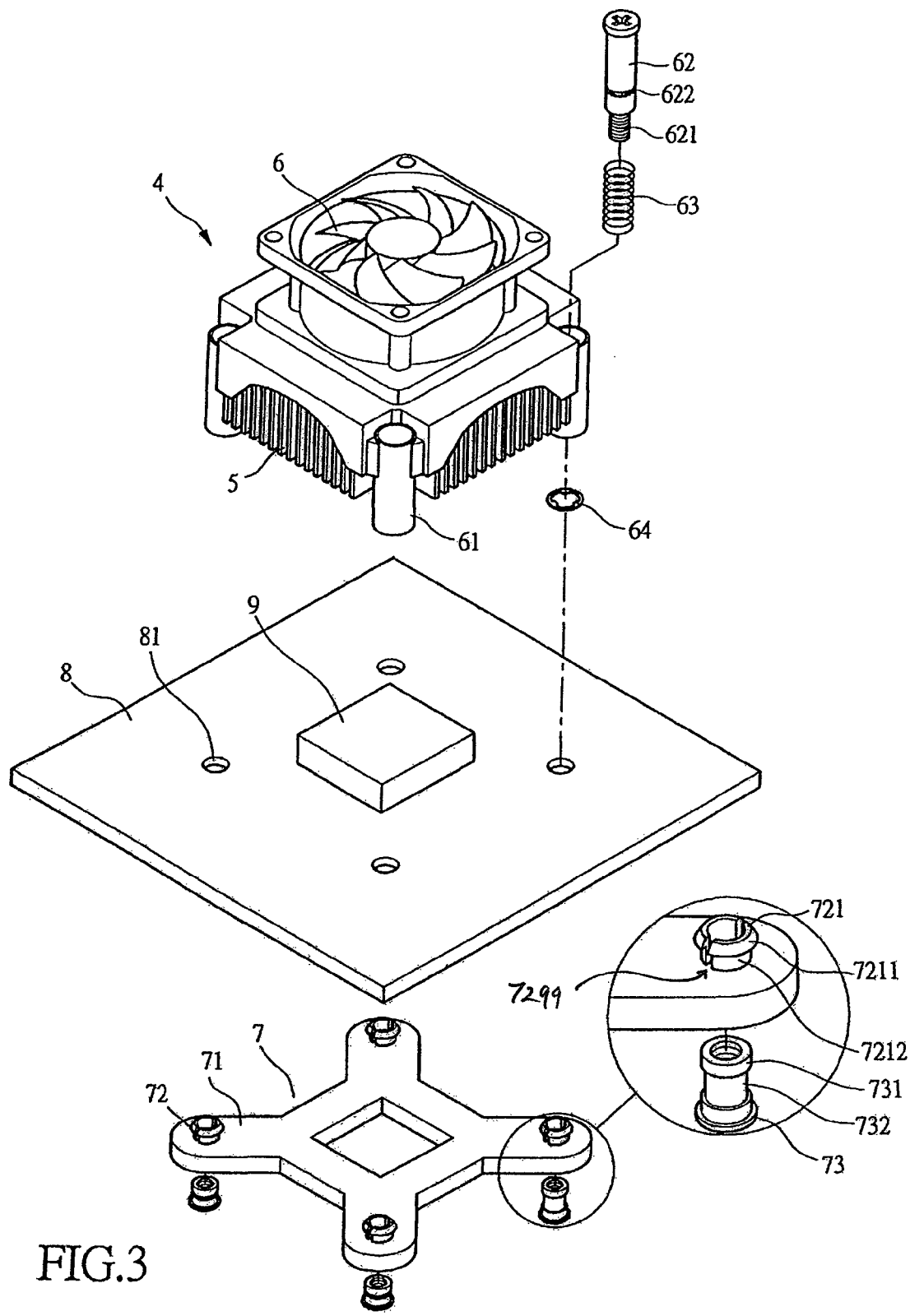
FIG. 3 is an exploded view of a heat dissipation module in accordance with an embodiment of the present invention.

FIG. 3 shows a heat dissipation module 4 for a central processing unit in accordance with an embodiment of the present invention. The heat dissipation module 4 comprises a heat radiator 5, a heat dissipation fan 6, and a seat or base 7.

The heat dissipation fan 6 is arranged above the heat radiator 5. Locking tubes 61 are arranged at four corners of the heat dissipation fan 6. Each locking tube 61 receives a threaded fastener 62. A resilient element 63, e.g., a coil spring, is fit over the threaded fastener 62. The threaded fastener 62 has a lower end forming a threaded section 621. A circumferential slot 622 is formed at a location above the threaded section 621. The circumferential slot 622 is to receive an annular, e.g., O-ring, clip 64. The O-ring clip 64 is fit into the circumferential slot 622 to effect blocking after the threaded fastener 62 is inserted into the locking tube 61 to thereby allow the threaded fastener 62 to freely move up and down in the locking tube 61 without separating from the locking tube 61. Other shapes and/or configurations of clip 64 are within the scope of the present invention.

O-ring clip 64 can be omitted if the threaded fastener 62 is of a type disclosed in the copending application entitled "FASTENER WITH SNAP-ON FEATURE, HEAT DISSIPATION ASSEMBLY FOR CENTRAL PROCESSING UNIT AND METHOD OF USING THE SAME," Ser. No. 11/467,443, which is incorporated by reference herein in its entirety.

The base 7 is preferably made of high strength plastic, including but not limited to polybutelyne with glass filled nylon and other nylon materials. However, other suitable materials are not excluded. An arm 71 extends from each of four corners of the base 7. Each arm 71 has a snap-on fastening mechanism 72, preferably integrally formed therewith. The snap-on fastening mechanism 72 comprises two semi-tubular projections 721 (see the magnified view in FIG. 3) extending upwardly from the arm 71. The upper ends of the projections 721 together define a truncated cone shape 7211 and the lower ends of the projections 721 together form a cylinder shape 7212. The truncated cone shape 7211 has a bottom that has an outside diameter greater than the cylinder shape 7212, thereby providing the snap-on fastening mechanism 72. The snap-on fastening mechanism 72 is formed, e.g., by molding, to surround a post 73 which has a hollow head 731. Other methods of forming the snap-on fastening mechanism 72, such as gluing, are not excluded.

The post 73 is preferably made of metal and formed with threads in an interior of the hollow head 731 to threadedly engage the threaded fastener 62. The head 731 extends upwardly beyond the snap-on fastening mechanism 72. The head 731 has an outside diameter greater than an inside diameter of the snap-on fastening mechanism 72. The post 73 has a neck 732 at a location below the head 731. The snap-on fastening mechanism 72 abuts against the neck 732 and the post 73 is fit and retained in the snap-on fastening mechanism 72 without separation from the base 7. Post 73 can also be made from plastic or other suitable material. Post 73 and the respective snap-on fastening mechanism 72 can be integrally formed as a single item which is attached to base 7 by any suitable methods, such as gluing, pressing, etc. or which is formed directly off of base 7 so as to be integral with base 7.

Figure 4:
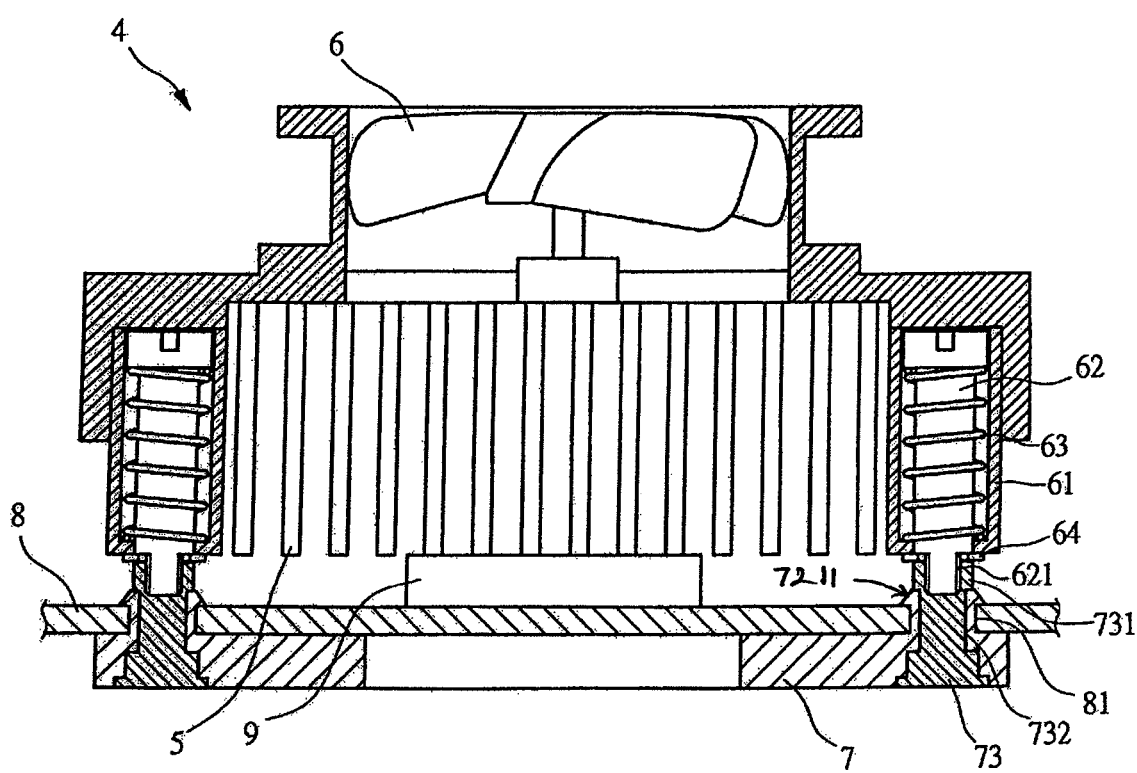
FIG. 4 is a cross sectional view showing the heat dissipation module of FIG. 3 in use.

As shown in FIG. 4, to mount the heat dissipation module 4 to a circuit board 8, the base 7 is mounted to the circuit board 8 from an underside of the circuit board 8, and the snap-on fastening mechanisms 72 of the base 7 extend into through holes 81 defined in the circuit board 8, respectively. At this time, the snap-on fastening mechanisms 72 and the posts 73 are simultaneously fit into and through the through holes 81 of the circuit board 8, with the circuit board 8 secured by the snap-on fastening mechanisms 72, whereby the base 7 is temporarily secured on the circuit board 8.

In an embodiment, the lip defined by truncated cone shape 7211 is radially flexible so as to allow the snap-on fastening mechanisms 72 with the posts 73 received therein to be passable, with snap action, through the through holes 81.

In a further embodiment, the space 7299 between two halves 721 allows halves 721 to flex inwardly. The size and/or shape of neck 732 of post 73 is/are configured such that there is a clearance between neck 732 and inner walls of projections 721 when post 73 is received in the respective snap-on fastening mechanism 72. As a result, the presence of post 73 between halves 721 will not completely destroy flexibility of halves 721, which are allowed to flex sufficiently inwardly to, in turn, allow the snap-on fastening mechanism 72 with the post 73 received therein to be passable, with snap action, through the respective through hole 81.

After the base 7 has been temporarily secured on the circuit board 8, the threaded fasteners 62 are tightened to engage with the matching threads within the hollow heads 731 of the posts 73, and thus the heat radiator 5 abuts against the central processing unit 9. The heat from the central processing unit 9 can be transferred to the heat radiator 5 and then dissipated by the heat dissipation fan 6.

Figure 3A:
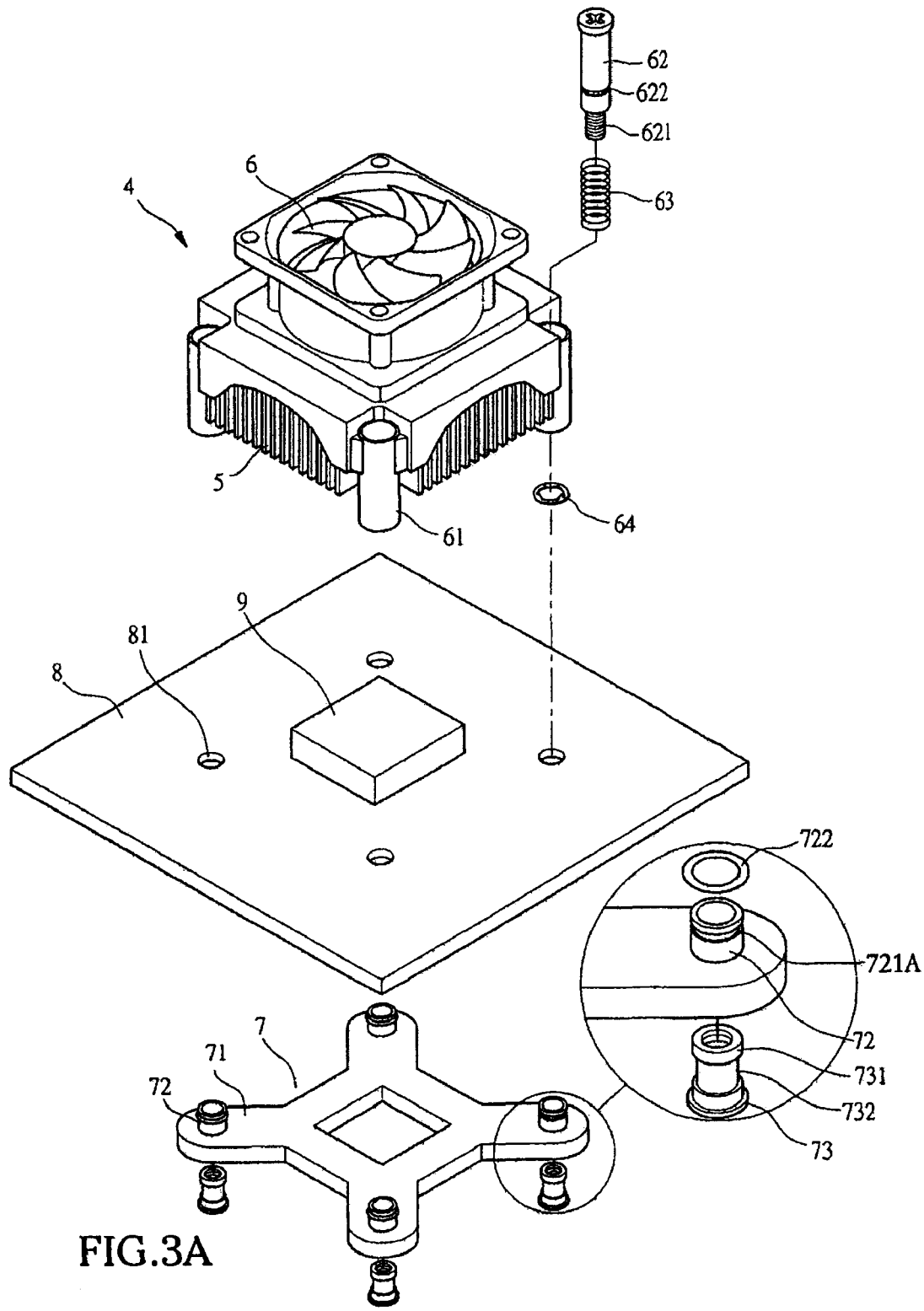
FIG. 3A is an exploded view of a heat dissipation module in accordance with a further embodiment of the present invention.

FIG. 3A shows a heat dissipation module 4 for a central processing unit in accordance with a further embodiment of the present invention. The embodiment of FIG. 3A is different from the embodiment of FIG. 3 in that the snap-on fastening mechanism 72 is a tubular member which is formed to surround each post 73. The snap-on fastening mechanism 72 has a circular groove 721A in which is fitted a resilient O-ring 722. The O-ring 722 has an outer diameter greater than that of the tubular member.

Figure 4A:
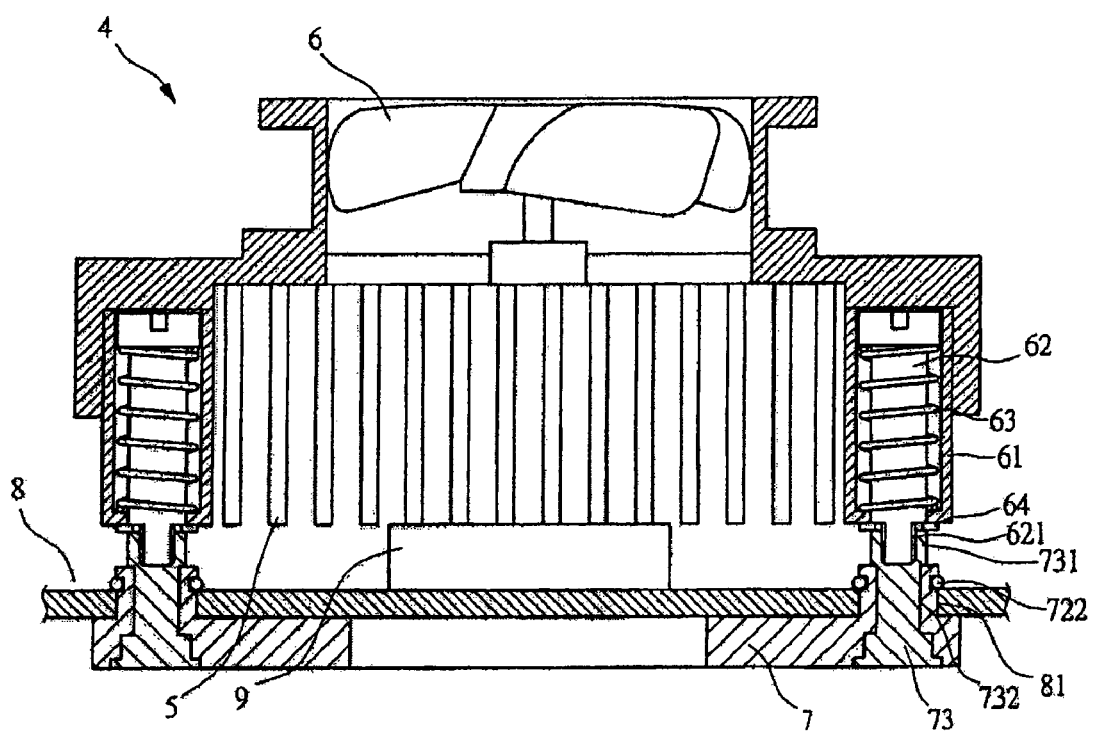
FIG. 4A is a cross sectional view showing the heat dissipation module of FIG. 3A in use.

As shown in FIG. 4A, to mount the heat dissipation module 4 to a circuit board 8, the seat 7 is mounted to the circuit board 8 from an underside of the circuit board 8, the snap-on fastening mechanisms 72 of the seat 7 extend into through holes 81 defined in the circuit board 8, respectively, and the O-rings 722 are radially inwardly deformed (or moved if they are spring loaded) to allow the snap-on fastening mechanisms 72 to pass through the holes 81. The snap-on fastening mechanisms 72 and the posts 73 are simultaneously fit into the through holes 81 of the circuit board 8. After the O-rings 722 have cleared the holes 81, the O-rings 722 return to their initial state or position and securing the seat 7 temporarily on the circuit board 8. Further, the threaded fasteners 62 are tightened, and thus the heat radiator 5 abuts against the central processing unit 9. The heat from the central processing unit 9 can be transferred to the heat radiator 5 and then dissipated by the heat dissipation fan 6.

Figure 5:
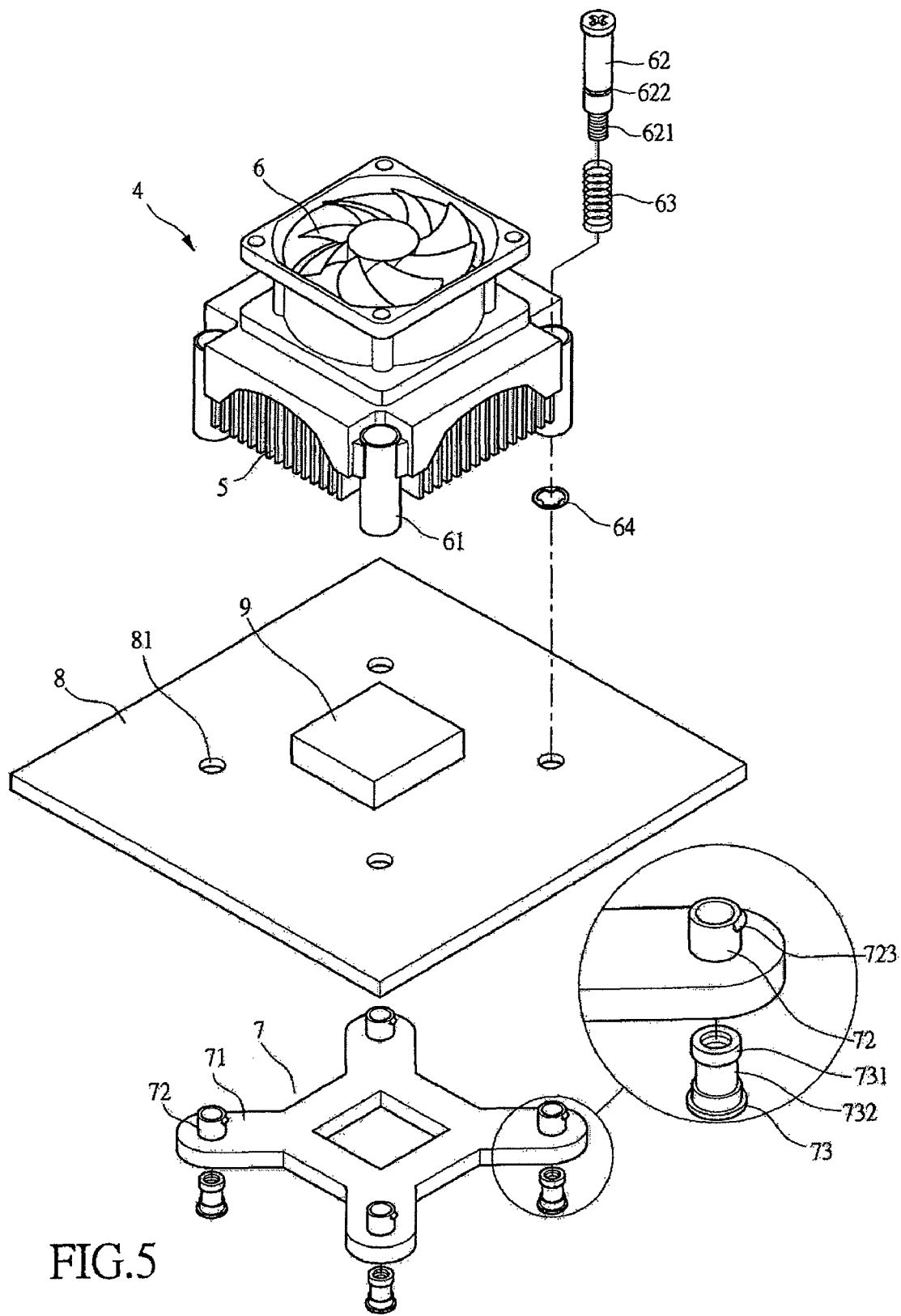
FIG. 5 is an exploded view of a heat dissipation module in accordance with a further embodiment of the present invention.
Figure 6:
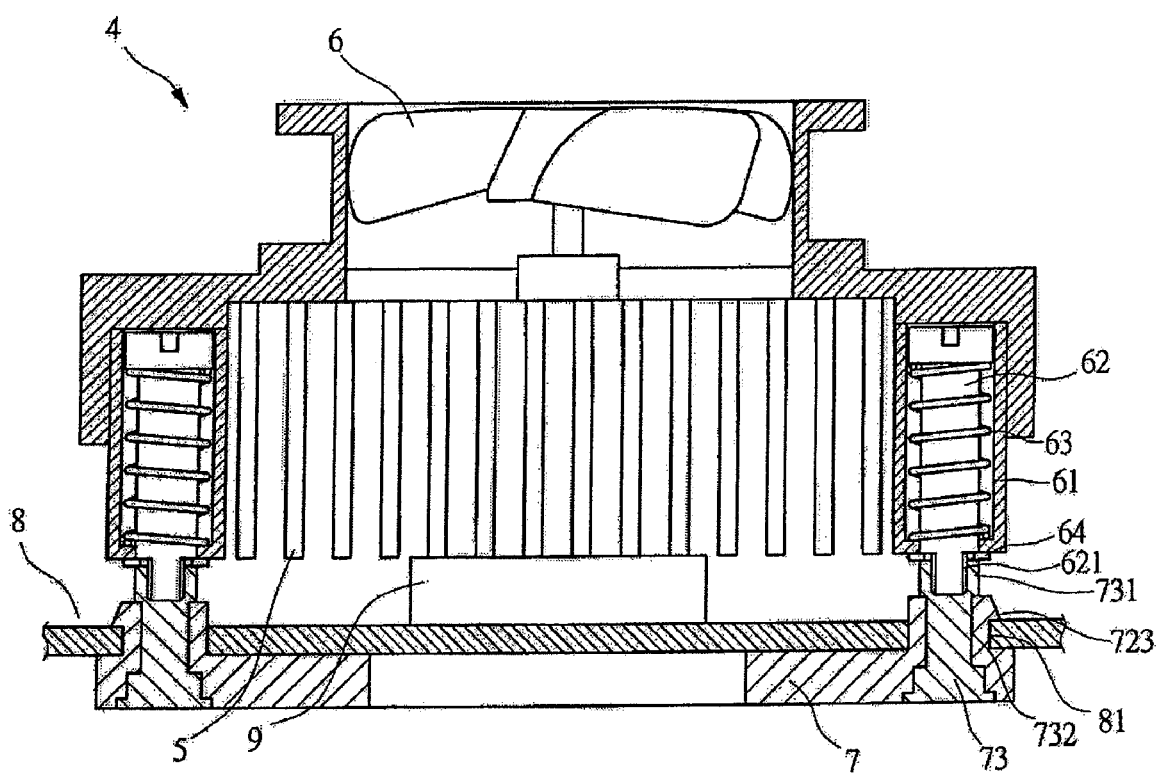
FIG. 6 is a sectional view showing the heat dissipation module of FIG. 5 in use.

FIGS. 5 and 6 illustrate a further preferred embodiment of the present invention, in which the upper end of a tubular member of the snap-on fastening mechanism 72 is provided with an elastically deformable lug 723 which is shaped as a portion of a truncated cone member. When the seat 7 is mounted to the circuit board 8 from an underside of the circuit board 8, the snap-on fastening mechanisms 72 of the seat 7 extend into through holes 81 defined in the circuit board 8, respectively, and the lugs 723 are radially inwardly deformed to allow the snap-on fastening mechanisms 72 to pass through the holes 81. The snap-on fastening mechanisms 72 and the posts 73 are simultaneously fit into the through holes 81 of the circuit board 8. After the lugs 723 have cleared the holes 81, the lugs 723 spring back radially outwardly and securing temporarily seat 7 on the circuit board 8. Further, the threaded fasteners 62 are tightened, and thus the heat radiator 5 abuts against the central processing unit 9.

Figure 7:
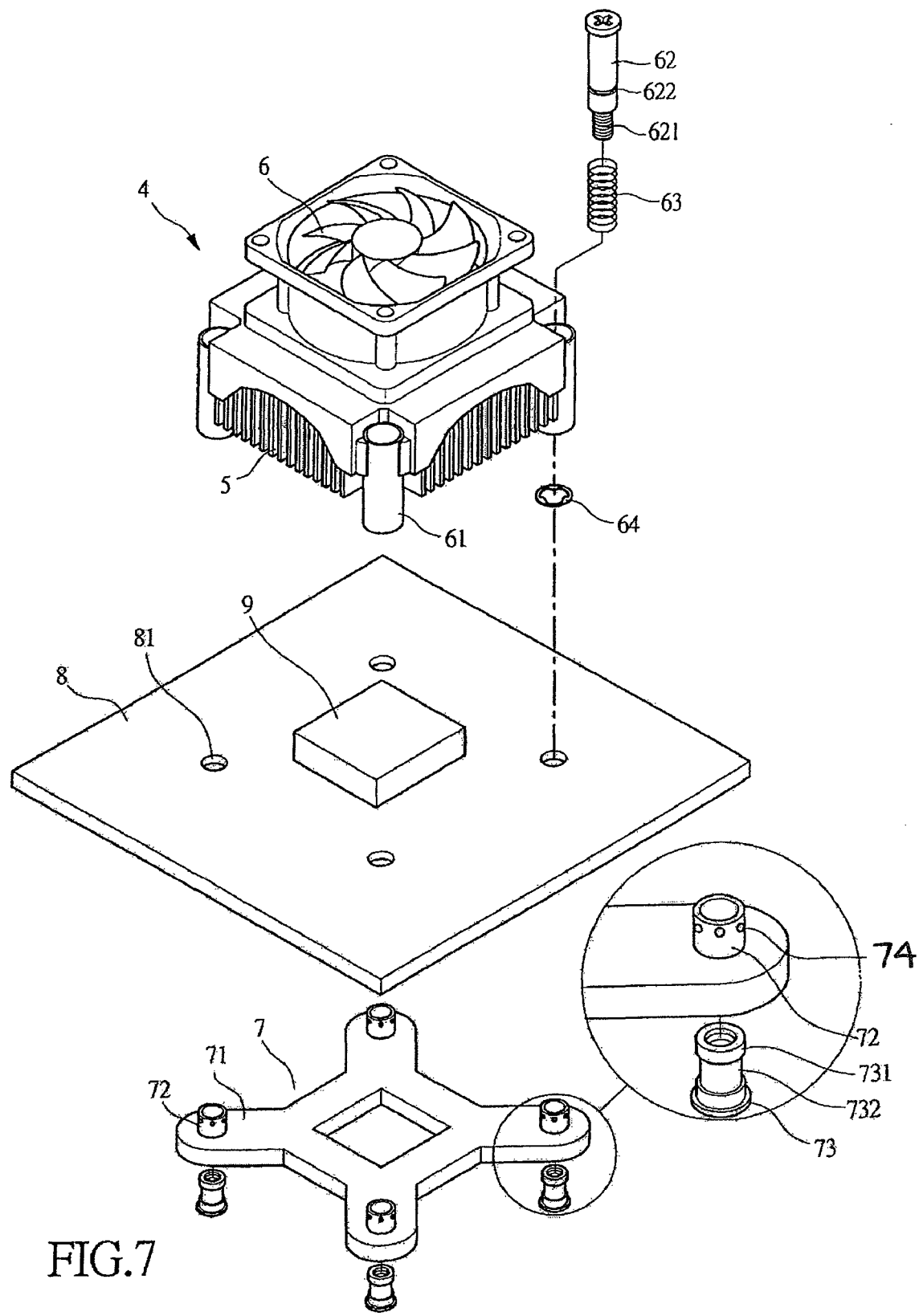
FIG. 7 is an exploded view of a heat dissipation module in accordance with a further embodiment of the present invention.
Figure 8:
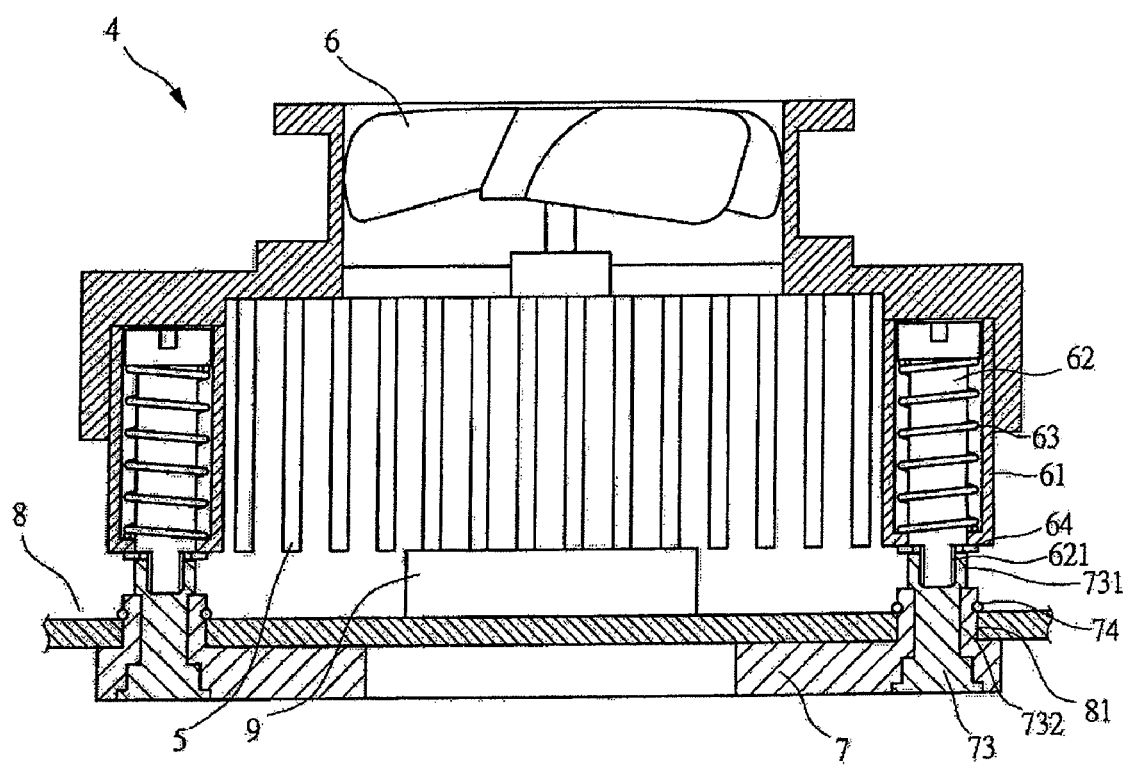
FIG. 8 is a sectional view showing the heat dissipation module of FIG. 7 in use.

FIGS. 7 and 8 illustrate a further embodiment of the present invention, in which the circumferential surface of the snap-on fastening mechanism 72 has a plurality of spaced-apart recesses in each of which is fitted a resilient ball 74. When the seat 7 is mounted to the circuit board 8 from an underside of the circuit board 8, the snap-on fastening mechanisms 72 of the seat 7 extend into through holes 81 defined in the circuit board 8, respectively, and the balls 74 are radially inwardly deformed (or moved if the balls are spring loaded) to allow the snap-on fastening mechanisms 72 to pass through the holes 81. The snap-on fastening mechanisms 72 and the posts 73 are simultaneously fit into the through holes 81 of the circuit board 8. After the balls 74 have cleared the holes 81, the balls 74 return to their initial state or position and securing the seat 7 temporarily on the circuit board 8. Further, the threaded fasteners 62 are tightened, and thus the heat radiator 5 abuts against the central processing unit 9.

The effect of the embodiment is that the base 7 can be temporarily retained on the circuit board 8 by providing the snap-on fastening mechanisms 72, which encompass the posts 73, on the arms 71 of the base 7. Thus, C-clips serving as retainers or application of back glue will no longer be needed. The mounting the base 7 can thus be simplified. Further, in embodiments where the base 7 is made of high strength plastic, the conventional arrangement of additional insulation parts can be omitted, which in turn effectively reduces the costs of heat dissipation module 4 and also reduces interference with the electrical paths of the circuit board 8 caused by the base 7.

In each of the disclosed embodiments, each post 73 can be made integrally with, i.e., from the same high strength plastic material as, the respective snap-on fastening mechanism 72. Each post 73 and the respective snap-on fastening mechanism 72 can be also made of metal or other suitable material.

In further embodiments, posts 73 can be independently fit through the holes 81 without the respective snap-on fastening mechanism 72.

While the present invention has been illustrated by the description of the embodiments thereof, and while the embodiments have been described in considerable detail, it is not the intention of the applicant to restrict or in any way limit the scope of the appended claims to such detail. Additional advantages and modifications could be made herein without departing from the scope of the described embodiments as defined by the appended claims. Furthermore, although elements of the described embodiments may be described or claimed in the singular, the plural is contemplated unless limitation to the singular is explicitly stated.

What is claimed is:

1. A heat dissipation assembly for a central processing unit, the heat dissipation assembly comprising:
   a heat radiator adapted to contact the central processing unit from above;
   a base adapted to support the central processing unit from below;
   a post extending upward from the base and having a hollow upper head with an internal thread therein to receive and threadedly engage with an elongated fastener; and
   at least a snap-on fastening mechanism which comprises a tubular member extending upward from the base and around the post and which is adapted to snap into a through hole formed in a supporting substrate of the central processing unit;
   the heat radiator comprising at least a fastener receiving portion for receiving the elongated fastener and aligning the elongated fastener with the post;
   wherein the post and the tubular member comprise different materials;
   wherein the post further comprises a neck portion below the upper head and surrounded by the tubular member; and
   wherein the upper head extends upwardly beyond the tubular member and has an outer diameter greater than both an inner diameter of the tubular member and an outer diameter of the neck portion.

2. The heat dissipation assembly as claimed in claim 1, wherein the tubular member comprises two semi-tubular projections surrounding said post and spaced from each other by two gaps.

3. The heat dissipation assembly as claimed in claim 2, wherein upper ends of the semi-tubular projections together define a truncated cone shape.

4. The heat dissipation assembly as claimed in claim 1, wherein the snap-on mechanism further comprises a resilient O-ring fittable in a circumferential groove of the tubular member.

5. The heat dissipation assembly as claimed in claim 1, wherein the tubular member comprises at an upper end thereof a resiliently deformable radial lug.

6. The heat dissipation assembly as claimed in claim 5, wherein the lug is shaped as a portion of a truncated cone.

7. The heat dissipation assembly as claimed in claim 1, wherein the tubular member comprises on a circumferential surface thereof a plurality of circumferentially spaced recesses in each of which a resilient ball is received and retained.

8. The heat dissipation assembly as claimed in claim 1, further comprising said elongated fastener.

9. The heat dissipation assembly as claimed in claim 8, further comprising a heat dissipation fan attachable to said heat radiator.

10. The heat dissipation assembly as claimed in claim 1, wherein the post comprises a metal and the tubular member comprises a plastic.

11. The heat dissipation assembly as claimed in claim 1, wherein the tubular member comprises a moldable material molded around the post.

12. The heat dissipation assembly as claimed in claim 1, wherein the tubular member comprises a moldable material molded around the neck portion of the post.

13. The heat dissipation assembly as claimed in claim 12, wherein the post comprises a metal, and the tubular member and the based comprise a plastic molded around the neck portion of the post.

14. A base for use with a heat radiator on top of a central processing unit, the base adapted to support the central processing unit from below and comprising:
    at least a snap-on fastening mechanism adapted to snap into a through hole formed in a supporting substrate of the central processing unit; and
    a post within said snap-on fastening mechanism and adapted to engage with an elongated fastener used for fastening, in use, the heat radiator to said base with the central processing unit positioned therebetween;
    said post extending upward from the base and having a hollow upper head with an internal thread therein to receive and threadedly engage with the elongated fastener;
    wherein
    said snap-on fastening mechanism comprises two semi-tubular projections extending upward from the base, surrounding said post, and being spaced from each other by two gaps; and
    a clearance is defined between inner walls of the semi-tubular projections and an outer surface of the post that faces the inner walls to permit the semi-tubular projections to flex inwardly while passing through the through hole formed in the supporting substrate.

15. The base as claimed in claim 14, wherein upper ends of the semi-tubular projections together define a truncated cone shape.

16. The base as claimed in claim 14, wherein the post and the tubular member comprise different materials.

17. The base as claimed in claim 16, wherein the tubular member comprises a plastic molded around the post which comprises a metal.

18. The base as claimed in claim 17, wherein
    the post further comprises a neck portion below the upper head and surrounded by the molded plastic of the tubular member; and
    the upper head extends upwardly beyond the tubular member and has an outer diameter greater than an inner diameter of the tubular member.

19. A method of mounting a heat radiator on top of a central processing unit using a base which comprises at least a snap-on fastening mechanism and a post within said snap-on fastening mechanism, said method comprising:
    snapping a through hole formed in a supporting substrate of the central processing unit over the snap-on fastening mechanism of said base to temporarily fixing said central processing unit on said base; and
    fastening the heat radiator placed on top of the central processing unit to said base using an elongated fastener that threadedly engages with the post of said base;
    wherein
    the post extends upward from the base and has a hollow upper head with an internal thread therein to receive and threadedly engage with the elongated fastener;
    said snap-on fastening mechanism comprises a tubular member extending upward from the base and around the post;
    the post and the tubular member comprise different materials; and
    said tubular member comprises an inwardly flexible element which, in said snapping, flexes inwardly to allow the tubular member to pass through the through hole from an underside of the supporting substrate, and then flexes outwardly to engage an upperside of the supporting substrate to temporarily fix said central processing unit on said base.

* * * * *